(12) United States Patent
Zhang

(10) Patent No.: US 6,825,671 B1
(45) Date of Patent: Nov. 30, 2004

(54) INTEGRATED ELECTROMIGRATION LENGTH EFFECT TESTING METHOD AND APPARATUS

(75) Inventor: Wei Zhang, San Jose, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 68 days.

(21) Appl. No.: 10/082,431

(22) Filed: Feb. 22, 2002

(51) Int. Cl.[7] .................. G01R 31/08; G01R 31/02
(52) U.S. Cl. ........................ 324/525; 324/763
(58) Field of Search ................ 324/525, 527–528, 324/691, 699, 716–718, 538–540, 73.1, 158.1, 719; 257/734, 758

(56) References Cited

U.S. PATENT DOCUMENTS 5,900,735 A * 5/1999 Yamamoto .............. 324/537
6,191,481 B1 * 2/2001 Bothra et al. ............ 257/734
6,320,391 B1 * 11/2001 Bui ......................... 324/537
2003/0080766 A1 * 5/2003 Fetterman et al. ........ 324/763

* cited by examiner

Primary Examiner—Anjan Deb
Assistant Examiner—Amy He
(74) Attorney, Agent, or Firm—Martine & Penilla, LLP

(57) ABSTRACT

Apparatus and methods are disclosed for determining the critical length of a conductor. In one aspect, a system may include at least one device under test (DUT) including at least one test strip of a metal under test. The test strip may be formed from a series of segments of the metal under test. The system may be configured to detect electromigration in the DUT using Blech's law. The system may be further configured to detect a rising voltage drop across the metal strips under test, and furthermore to calculate the electrical resistance change of the metal strips under electromigration testing conditions. The obtained results may be applied to ULSI design stage to improve the EM rule violation examination.

26 Claims, 9 Drawing Sheets

INTEGRATED ELECTROMIGRATION LENGTH EFFECT TESTING METHOD AND APPARATUS

BACKGROUND

1. Field of the Disclosure

The disclosure relates generally to semiconductor testing, and in particular to electromigration length effect testing.

2. The Prior Art

Dramatic shrinkage in device feature sizes has driven ultra large scale integration (ULSI) into the deep ¼μ regime. However, electromigration (EM)-induced interconnect failures have continued to be one important factor in long-term device reliability.

Electromigration is caused by the momentum exchange between metal ions and accelerated electrons, and can result in the displacement of the metallic ions comp rising an interconnect. EM may be especially prominent at higher temperatures and current densities, and can contribute to failures such as open circuits, particularly when coupled with tensile stress; or short circuits, when associated with compressive stress.

SUMMARY

Apparatus and methods are disclosed for determining the critical length of a conductor. In one aspect, a system may include at least one device under test (DUT) including at least one test strip of a metal under test. The test strip may be formed from a series of segments of the metal under test.

The system may include a plurality of DUTs, and the segments of each of the DUTs may have a unique length. A DUT according to this disclosure may include decoder and selection circuitry and may be embodied within an integrated circuit. The integrated circuit containing said DUT may be mounted on a hot chuck.

The system may be configured to detect electromigration in the DUT using Blech's law. The system may be further configured to detect a rising voltage drop across the metal strips under test.

BRIEF DESCRIPTION OF THE DRAWING FIGURES

DETAILED DESCRIPTION

Figure 1A:
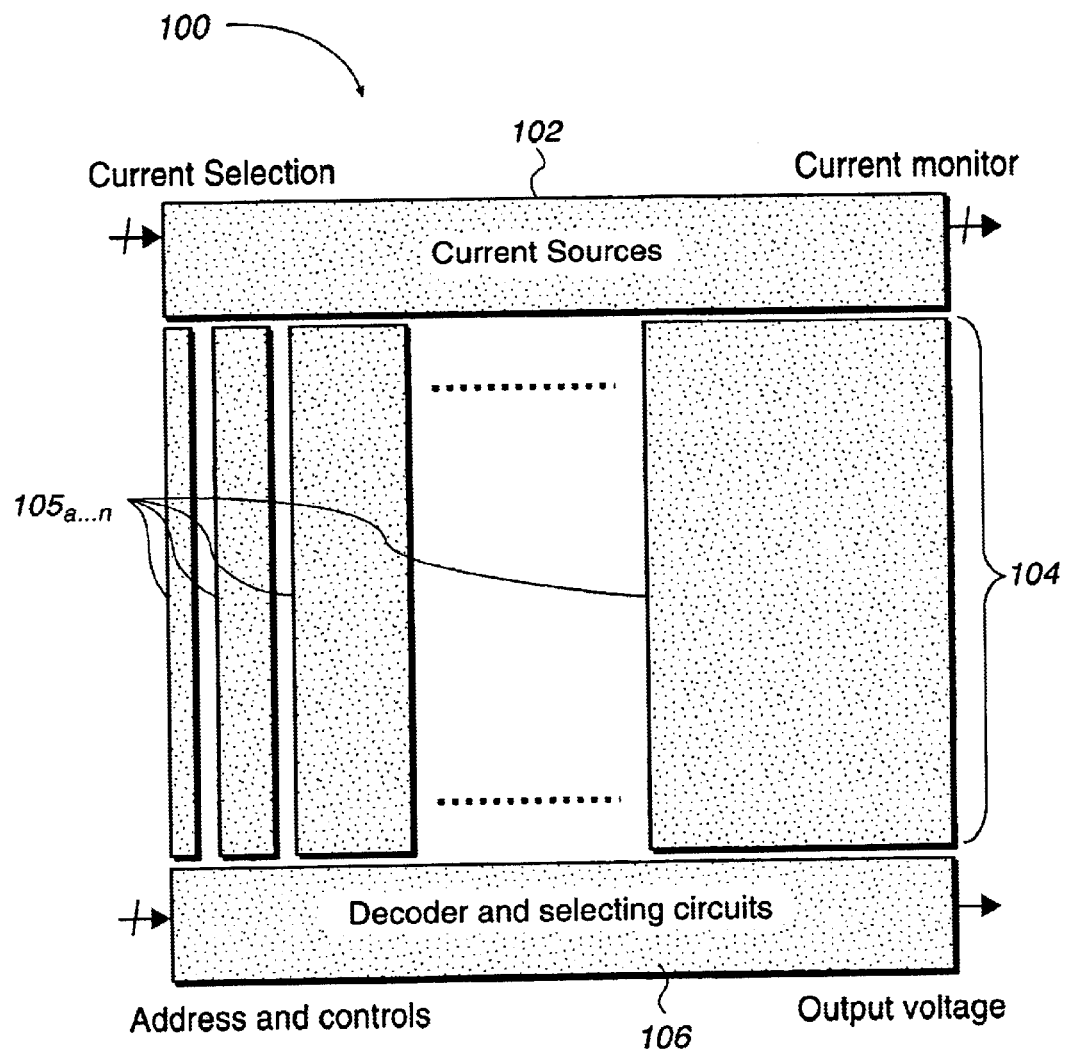
FIG. 1A is a block diagram of an electromigration testing system.

Persons of ordinary skill in the art will realize that the following description is illustrative only and not in any way limiting. Other modifications and improvements will readily suggest themselves to such skilled persons having the benefit of this disclosure. In the following description, like reference numerals refer to like elements throughout.

This disclosure may relate to data communications. Various disclosed aspects may be embodied in various computer and machine readable data structures. Furthermore, it is contemplated that data structures embodying the teachings of the disclosure may be transmitted across computer and machine readable media, and through communications systems by use of standard protocols such as those used to enable the Internet and other computer networking standards.

The disclosure may relate to machine readable media on which are stored various aspects of the disclosure. It is contemplated that any media suitable for retrieving instructions is within the scope of the present disclosure. By way of example, such media may take the form of magnetic, optical, or semiconductor media, and may be configured to be accessible by a machine as is known in the art.

Various aspects of the disclosure may be described through the use of flowcharts. Often, a single instance of an aspect of the present disclosure may be shown. As is appreciated by those of ordinary skill in the art, however, the protocols, processes, and procedures described herein may be repeated continuously or as often as necessary to satisfy the needs described herein. Accordingly, the representation of various aspects of the present disclosure through the use of flowcharts should not be used to limit the scope of the present disclosure.

Exemplary embodiments of disclosed apparatus and methods may be disclosed herein. The word "exemplary" is used exclusively herein to mean "serving as an example, instance, or illustration." Any embodiment described as an "exemplary embodiment" is not to be construed as necessarily preferred or advantageous over other embodiments described herein.

This disclosure presents an integrated electromigration testing device, gel methodology and system for determining the critical, or Blech length, of a conductor. Using a device of this disclosure, one may determine the critical length of a conductor through a computerized electromigration testing procedure without the need for microscopic methods. The results of the tests disclosed herein may then be provided to the layout design and verification stages of engineering to further predict electromigration reliability. The disclosed methodology is expected to improve the electromigration violation screening procedure by reducing the line length scanning scope which can significantly shorten the runtime without sacrificing design reliability.

The disclosed system utilizes Blech's equation, given as:

$$j \times L_b = C$$

where
  $j$ = current density;
  $L_b$ = Blech length of a conductor; and
  $C$ = a constant depending on material properties and temperature.

Blech's equation indicates that under certain current densities, a critical length $L_b$ exists. If the conductor is shorter than this critical length, no failure will occur as a result of the fact that a dynamic equilibrium will form between electromigration-induced ion flux and backward ion diffusion prior to tensile or compressive stress within the conductor reaching a critical magnitude. Thus, the system of this disclosure may be configured to sense whether a conductor of a particular length may reach this equilibrium prior to excessive stress occurring. By ensuring that tensile stress does not exceed a desired magnitude, the teachings of this disclosure may prevent failure of electrical conductors.

As will be appreciated by those of ordinary skill in the art, tensile stress-induced open circuits are more likely to occur than compressive stress-induced short circuits. Therefore the discussion below will focus on primarily tensile stress-induced failures, though the present disclosure is equally applicable to other types failures.

Electromigration testing methods and apparatus will be first disclosed by first describing exemplary structure, and next through exemplary operation aspects.

Exemplary Structure

FIG. 1A is a functional block diagram of a electromigration testing system 100 in accordance with the teachings of this disclosure. It is contemplated that the system 100 may be deployed in a wide variety of environments. For example, the system 100 may be embodied within a stand-alone computer-controlled test and measurement device, including a processor and associated hardware (e.g., a probe card) and software. Such a device may further include memory for the storage and retrieval of data and instructions, and network interfaces for providing communication using protocols known in the art, such as IEEE 488 or IEEE 1394.

The system 100 may include at least one current source 102 for providing current to at least one device under test. It is contemplated that any conventional current source known in the art may be employed in the system 100. As can be appreciated from FIG. 1A, the current sources 102 may be operatively coupled to outside devices for current selection and monitoring.

The system 100 may further include a device under test (DUT) 104 formed by at least one test strip $105_{a \ldots n}$. The DUT 104 may also include associated serving circuitry (described below). Exemplary embodiments of the DUT 104 will be described in more detail below.

The system 100 may further include decoder and selection circuitry 106. The decoder circuitry 106 is preferably configured to select and decode received signals from a particular DUT 104, and may comprise conventional circuitry as is known in the art. As can be appreciated from FIG. 1, the decoder circuitry 106 may also be configured to receive address and control signals, and to provide an output signal.

Figure 1B:
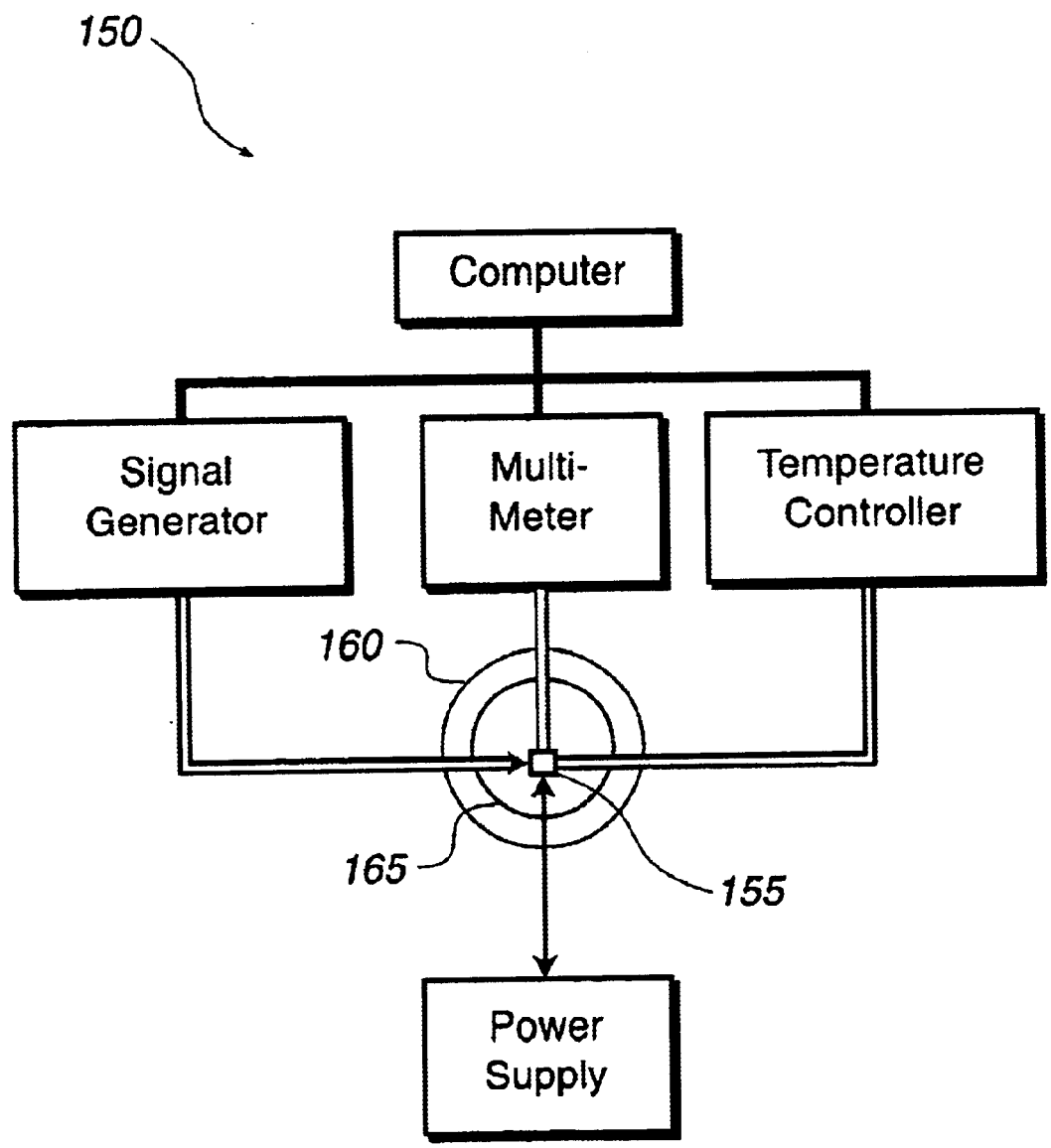
FIG. 1B is a further block diagram of an electromigration testing system.

FIG. 1B is a block diagram of one aspect of a test system 150. The system 150 may include a personal computer coupled to a signal generator, a multimeter, and a temperature controller through an IEEE-488 bus, which are in turn coupled to a DUT through a sensory device, such as an external probe. The DUT may be mounted on a hot chuck.

The computer may be configured for controlling the signal generator to select a test chip which may contain a group of metal lines as will be described in more detail below. As will be additionally described below, decoding/selecting circuitry on the DUT may apply a voltage drop across the metal group on the external probe, which can be sensed by the multimeter via the bus. The hot chuck temperature may be adjusted dynamically to keep the DUT temperature relatively constant by a programmable temperature controller. A temperature sensor may be coupled to the chip and located as close to the metal lines under test as possible.

The temperature dependence of a diode junction voltage or a metal resistance may be used as a sensing method. The temperature of the on-chip circuitry may be controlled below the 'burn-in' temperature, for example 105° C., while the DUT temperature should elevated as high as possible. It is contemplated that special care may be taken to isolate heat conduction between the DUT and the decoding and current source circuitry. Joule heating of the DUT may be desired to accelerate the EM testing. Additionally, the DUT may be located in the center of the host chip, while the surrounding decoding circuitry may be located as far away as possible.

Figure 2A:
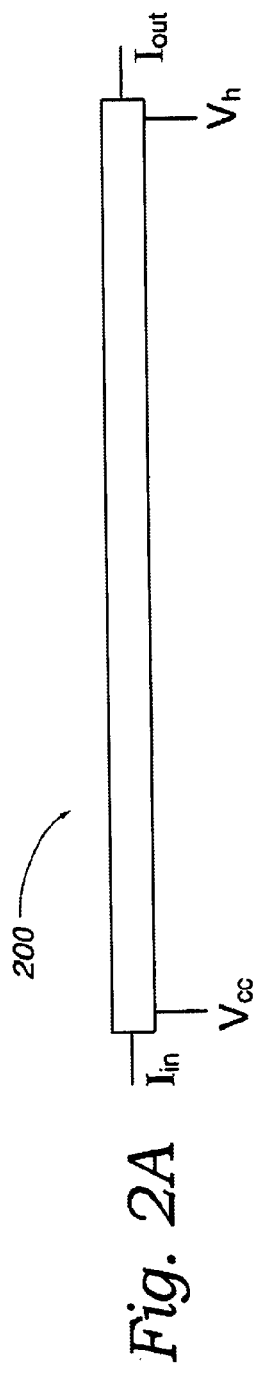
FIGS. 2A–2C are diagrams illustrating a device under test configured in accordance with this disclosure.
Figure 2B:
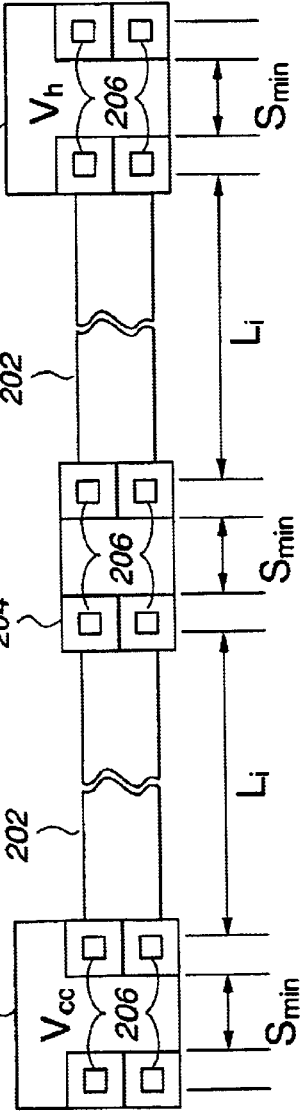
Figure 2C:
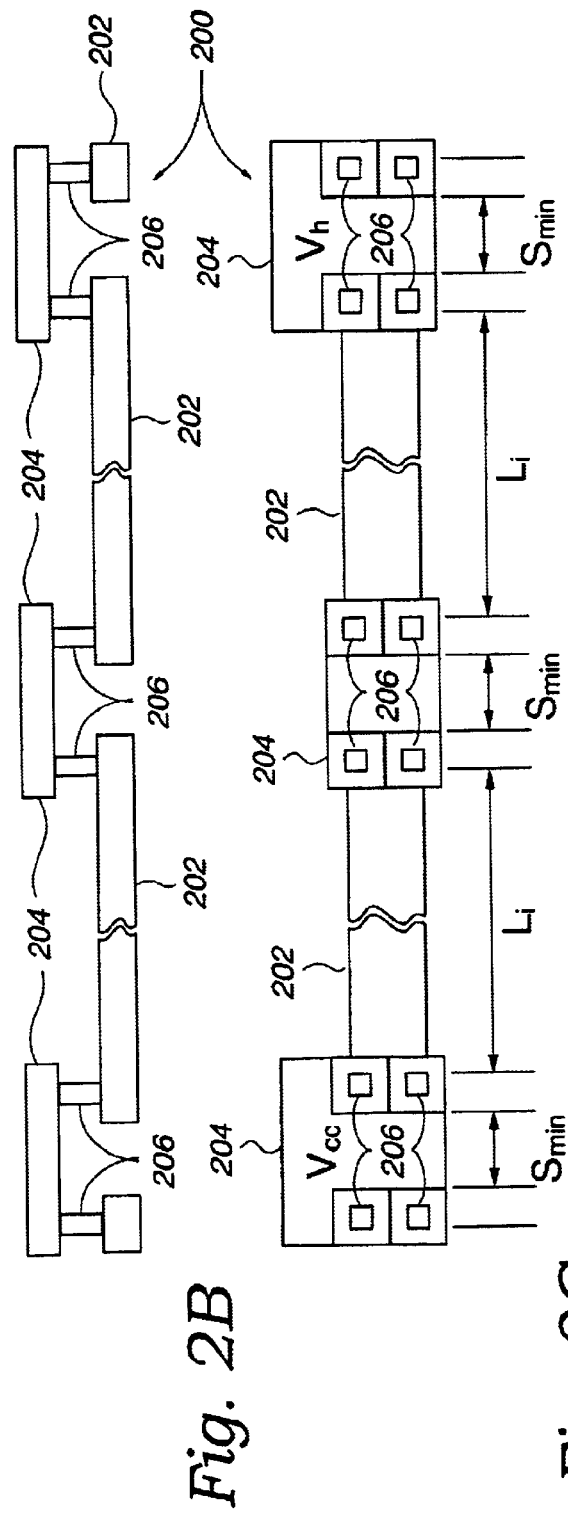

FIGS. 2A–2C are schematic diagrams illustrating a device under test configured in accordance with this disclosure. The structure of FIGS. 2A–2C may be employed as the DUT 104 of FIG. 1.

FIG. 2A is a diagram of a DUT 200 in accordance with the teachings of this disclosure. FIG. 2A shows that the DUT 200 may be modeled as a 4-terminal: device having an EM stressing current path $I_{in}$ to $I_{out}$, and two voltage probing terminals $V_{cc}$ and $V_{-h}$.

FIG. 2B and FIG. 2C are lateral cross-sectional diagrams of side and top views, respectively, of one aspect of a DUT 200. The DUT 200 may include a metal to be tested 202. The metal under test 202 may comprise any metal whose electromigration characteristics are desired to be tested, such as aluminum, copper, or other metals useful in the semiconductor arts.

In one aspect of a DUT 200, a plurality of lengths of the metal 202 may be joined to form a conductive chain for testing. It is contemplated that a plurality of strips of the metal under test 202 having a length of may be joined at a minimum spacing of $S_{min}$ by pieces of secondary metal 204 and vias 206 to form a DU 200. Thus, a DUT 200 may be formed by linking strips or segments of the metal to be tested. The metal strips under test may have a predetermined length and be linked at predetermined spacings. The lengths and width may be advantageously chosen depending on the application. For example, it is contemplated that the strips of the metal 202 may range in length $L_i$ from approximately 10 $\mu$m to 320 $\mu$m. The width of the metal line 202 may be chosen according to the specific silicon processing technology used to fabricate the DUT and target physical (layout) design using the same processing technology. For example, the width may be 1×, 2× or 3× of the minimum width specific by design rules known in the art. The value of $S_{min}$ is preferably chosen to be as short as possible. It is contemplated that the connecting metal layer may be sufficiently short such that EM will not happen occur in the connecting metal 204. Moreover, the connecting metal 204 may be at least 3× or 4× wider than metal 202 to lower the current density of 204 well below the EM threshold.

The DUT 200 may further include a connecting metal 204 for isolating EM ion flux between to metal strips 202 while maintaining electrical current continuity in the metal under test 202. It is contemplated that the metal under test 202 and the connecting metal 204 may be electrically coupled through the use of vias 206 formed as known in the art. In one exemplary aspect, the vias may comprise tungsten or any other type of EM resisting materials. As will be appreciated by those skilled in the art, tungsten acts as a barrier metal to EM, thus the use of tungsten vias will interrupt EM flux between the connecting metal and the metal under test. Thus any electromigration observed will be limited to the metal under test.

It is contemplated that other fastening methods may be employed, such as metal or laser-type fuses.

Figure 3:
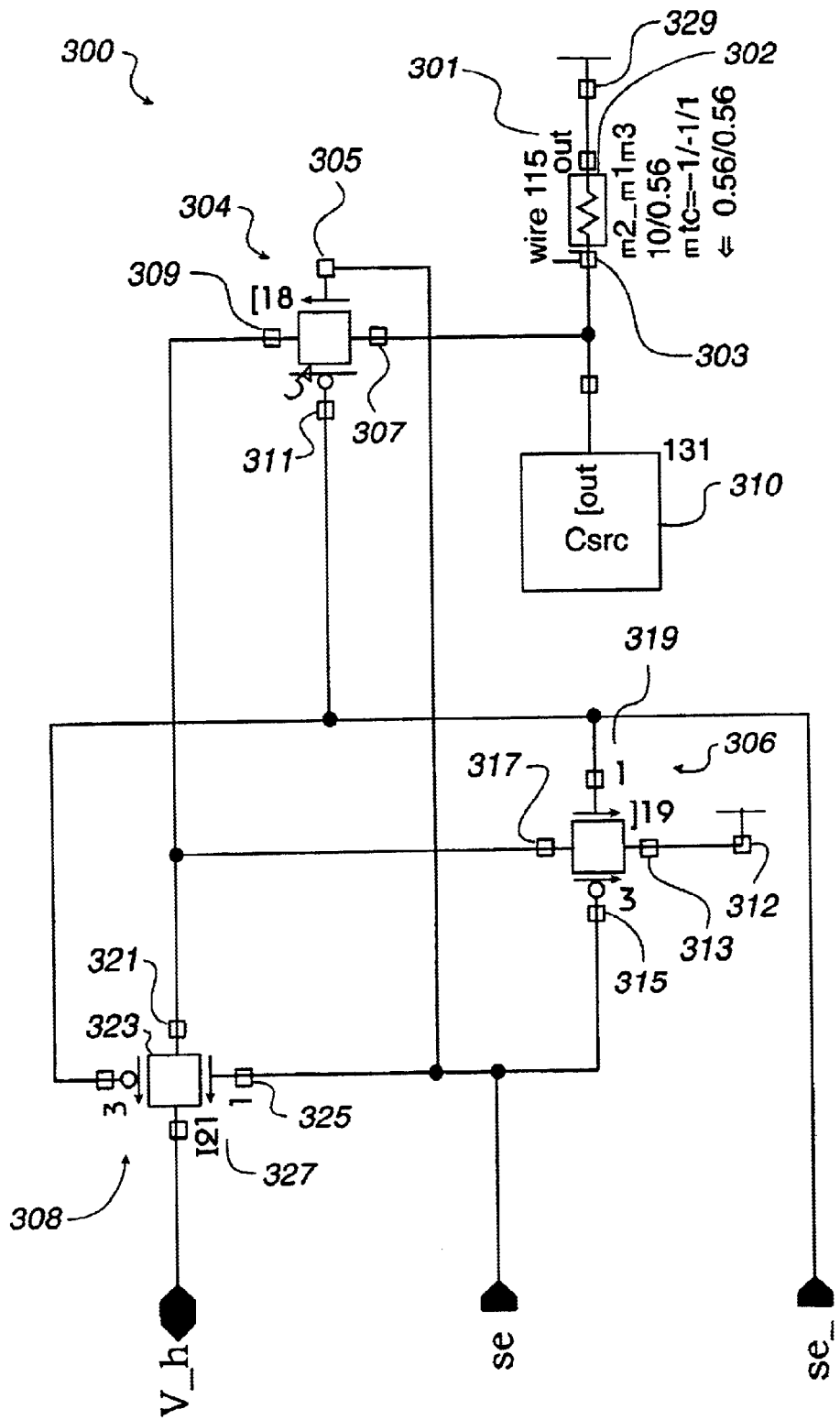
FIG. 3 is a schematic diagram of one aspect of a test circuitry.

FIG. 3 is a schematic diagram of one aspect of a test circuitry 300 configured in accordance with the teachings of this disclosure. The circuit of FIG. 3 may represent one test strip of a system and the associated test circuitry.

The test circuitry 300 may include a DUT 302 having an input terminal 301 and an output terminal 303. The DUT 302 may comprise a DUT as disclosed above. The input terminal 301 may be coupled to VCC through a voltage source terminal 329. The output terminal 303 may be coupled to conventional current source 310 for sinking current.

The test circuitry 300 may also include a transmission gate 304 for sensing the output of the DUT 302, a balancing gate 306 for balancing the charges applied to the DUT 302, and a transmission gate 308; for working together with gates 304 and 306 to pass the voltage drop across the DUT 302 the probing terminal $V_{-h}$. In an exemplary aspect of the test circuitry 300, the gates 304, 306, and 308 may comprise CMOS transmission gates formed by coupling complimentary transistors as is known in the art. It is contemplated that a wide variety of transistor gates may be employed.

The gate 304 may include a n-control terminal 305 coupled to a n-control terminal 325 of gate 308, a p-control terminal 315 of gate 306, and a select enable (se) signal. The gate 304 may also include a p-control terminal 311 coupled to a p-control gate 323 of gate 308, an n-control gate 319 of gate 306, and to an inverted select enable (se_) signal. The gate 304 may also include a first terminal 309 coupled to a first terminal 321 of gate 308, a first terminal 317 of gate 306, and to the se_signal. The gate 304 may also include a second terminal 307 coupled to the output node of the DUT 302 and the current source 310.

The gate 308 may also have a second terminal 327 configured to provide an output signal $V_{-h}$. The gate 306 may also include a second terminal 313 coupled to VCC through a terminal 312.

In operation, a select enable signal may be applied to the se terminal, and a complimentary signal to the se_ terminal. The voltage of the DUT at the terminal connecting the current sink may then be sensed at the $V_{-h}$ terminal.

Figure 4:
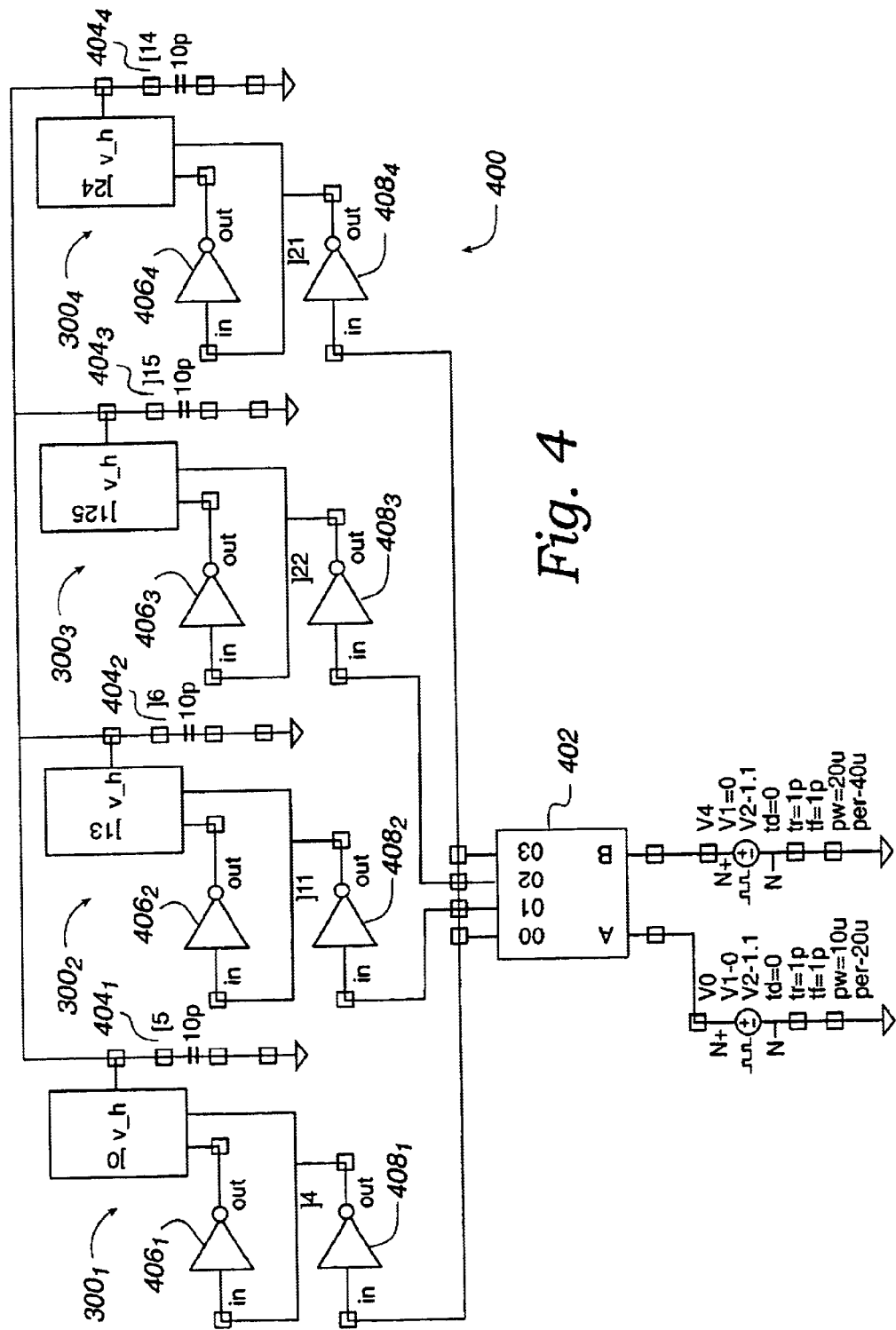
FIG. 4 is a schematic diagram of a system for testing the electromigration effects of a device under test.

FIG. 4 is a schematic diagram of a system 400 for testing the electromigration effects of a device under test configured in accordance with the teachings of this disclosure. The system 400 may include at least one DUT $300_{1\ldots n}$ which may be configured as disclosed above. In the aspect illustrated in FIG. 4, four DUTs $300_{1\ldots 4}$ are shown, it is contemplated that any number of DUTs may be tested in accordance with this disclosure.

Additionally, it is contemplated that each DUT may include a metal under test which has a predetermined length. In one aspect, the segments in each DUT may have a length unique from the segments of the other DUTs. Thus, the system 400 may include DUTs each having test strips of different lengths, enabling a single electromigration test to be performed simultaneously on test strips of different lengths.

The system 400 may further include a signal generator 402. The signal generator 402 may comprise a binary tree, a multiplexer, or a any decoder known in the art that can generate n outputs when driven by a binary input. An in-out Table 1 of an exemplary 2–4 decoder is as follows:

TABLE 1

| in 1 | in 0 | out 1 | out 2 | out 3 | out 4 |
|------|------|-------|-------|-------|-------|
| 0    | 0    | 1     | 0     | 0     | 0     |
| 0    | 1    | 0     | 1     | 0     | 0     |
| 1    | 0    | 0     | 0     | 1     | 0     |
| 1    | 1    | 0     | 0     | 0     | 1     |

Each DUT $300_{1\ldots n}$ may include coupling circuitry for coupling the se signal from the generator 402 to the respective DUT. The coupling circuitry is preferably configured to provide the se signal from the generator 402 to the se_ terminal of a DUT, and a complimentary se signal to the se terminal of a DUT.

In the aspect illustrated in FIG. 4, each DUT $300_{1\ldots n}$ has a corresponding first inverter $406_{1\ldots n}$ and a second inverter $408_{1\ldots n}$. For sake of clarity, the circuitry corresponding to the DUT $300_1$ will be described, through the description is equally applicable to each DUT $300_{1\ldots n}$.

The second inverter 40 may receive a se signal corresponding to DUT $300_1$ from the generator 402, and provide an inverted output to the se terminal of $DUT_1$ and to the input of first inverter $406_1$. The first inverter $406_1$ may then provide an inverted output se_ to the se_ terminal of $300_1$.

The $V_{-h}$ output terminal of each $DUT_{1\ldots n}$ may be coupled together to provide a common output node where an overall output signal $V_{-h}$ may be sensed as desired.

Each $V_{-h}$ output terminal may also include a respective capacitor $404_{1\ldots n}$ coupled between the $V_{-h}$ terminal and ground for emulate the total capacitive loading, including such factors as the chip bonding pad, probe tip, external wire and multimeter inputs. The value of the capacitor may vary depending on the configuration of the system or the fabrication of the device.

As will be appreciated from FIG. 4, the system of the present disclosure may be formed in a variety of advantageous manners. For example, each of the DUTs $300_{1\ldots n}$ may be formed as an integrated circuit. Additionally, the entire system of FIG. 4 may be formed as a single integrated device using conventional semiconductor techniques.

Figure 5:
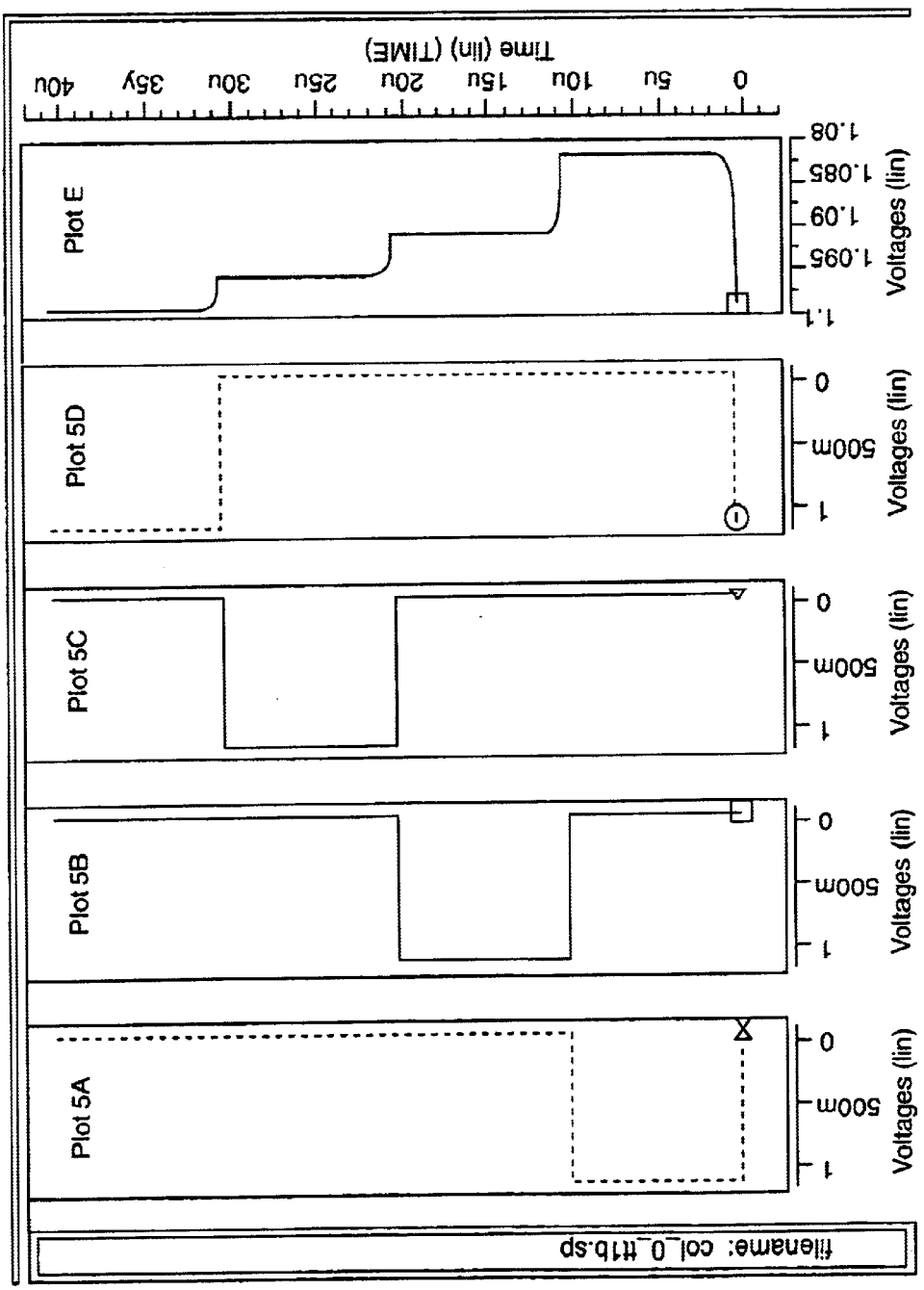
FIG. 5 shows a series of plots 5A–5E representing simulated voltage waveforms across 4 metal interconnect chains under electromigration tests.

FIG. 5 shows a series of plots 5A–5E representing a simulated electromigration test conducted in accordance with this disclosure, all plotted as voltage over a common time axis. Plots 5A–5D show one aspect of how a select signal se may be applied to the DUTs $300_{1\ldots 4}$ of FIG. 4. As illustrated in FIG. 5, the select signal may be applied to a plurality of DUTs as a sequential series of signals, with a select signal se being applied to each DUT in turn. In the example of FIG. 5, the simulation assumes that the four DUTs each have metal strips of different lengths.

Plot 5E of FIG. 5 is a plot showing the output signal $V_{-h}$ as sensed from the 120 common output node of FIG. 4. As can be seen from plot 5E, the different DUTs will each produce a unique output signal depending upon the DUT's individual properties.

Figure 6:
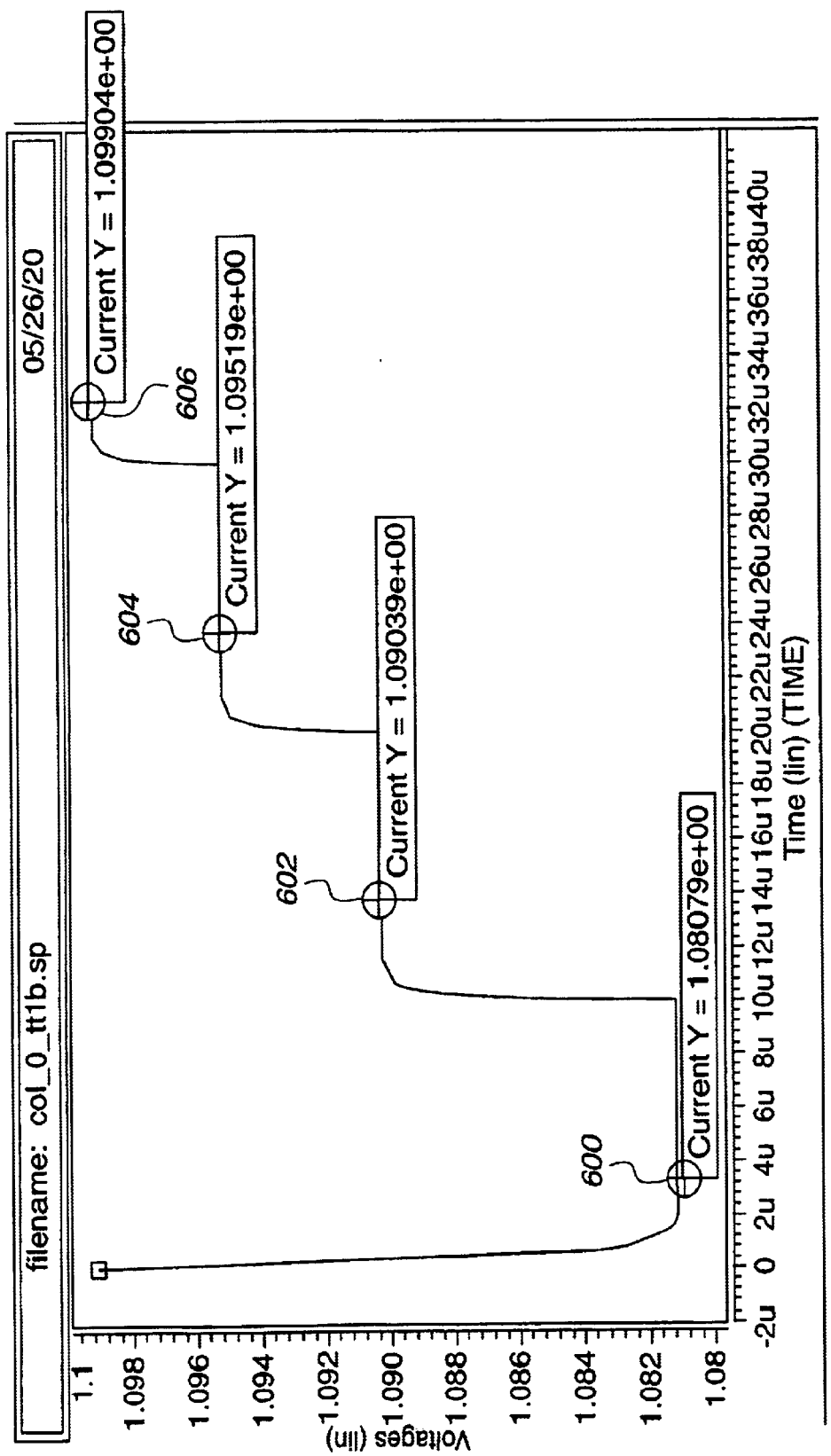
FIG. 6 is a more detailed plot of simulated voltages across each of the four groups of metal lines under test.

FIG. 6 is a more detailed plot of simulated voltages across each of the four groups of metal lines under test plotted over time. Test points 600–606 correspond to the plots for DUTs 1 . . . 4, respectively. The steps of the plot indicate differences in voltage drops across metal chains with different lengths, and thus different resistances. Additionally, the simulated current measurement for each DUT is plotted adjacent to the corresponding test point.

As mentioned above, the plots of FIGS. 4 and 5 are simulations. It is contemplated that actual measurements may show resistances which will change due to electromigration. It is further contemplated that the voltage levels of the DUTs will most likely increase from ideal levels due to electromigration effects. The system of this disclosure may thus be configured to sense any deviation from normal voltage levels. Such deviation may indicate the onset of electromigration, indicating that a critical line length has been determined.

Exemplary Operation

Using the measurement techniques and structure disclosed above, the voltage versus time relation (V–t curves) for groups of metal strips may be obtained under certain current density, j. (j=I/A, where I is the current and A cross sectional area of metal strip). Furthermore, the resistance change (typically an increase) versus time curve (delta R R0–t) can be calculated by R(t)=V(t)/I.

Figure 7:
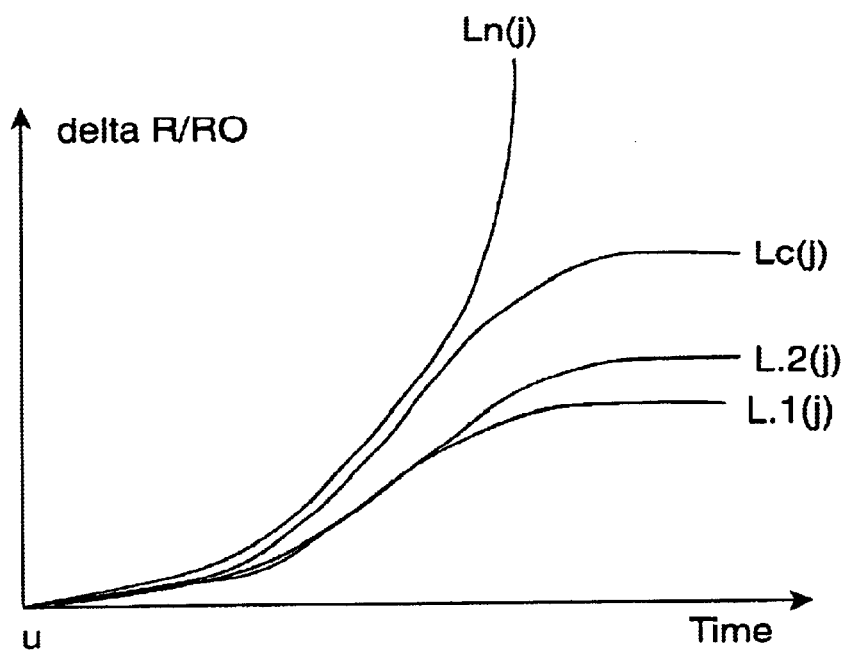
FIG. 7 is a plot illustrating resistance increase versus time for different metal lengths under test.

FIG. 7 is a plot showing a group of expected delta R/R0–t curves for different metal lengths, under a certain current density, j. The EM testing should last long enough to detect failure (for Ln) and saturation (L1–Lc). Lc is defined as the maximum length at which resistance saturation can be detected.

Thus, a relation of Lc versus current density, j, can be established by using multiple figures as shown in FIG. 7. An expected Lc–j (or reversed j–Lc) relation is shown in FIG. 7.

The Lc–j (or j–Lc) characteristics can be advantageously generated in form of design rules by silicon fabrication company for use by ULSI designers.

Figure 8:
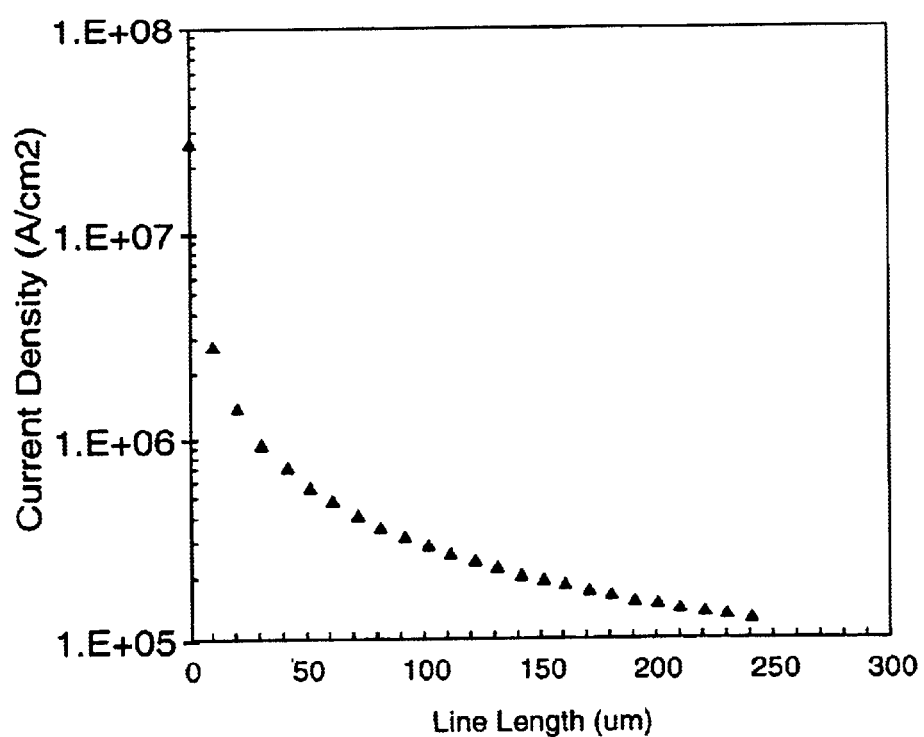
FIG. 8 is a plot illustrating Blech's law.

Additionally, an empirical constant C may be obtained from FIG. 8 according to the Blech equation (j×Lc C). It is contemplated that such information may be valuable during the early stages of design and layout, serving as a reference to monitor electromigration reliability or screen out EM violations.

For example, during post layout extraction and simulation, current density (j) of each metal line in a design can be calculated by using any standard commercial SPICE based simulator. Additionally, the metal line length (l) can also be measured by using related methodology, e.g. SKILL programming and/or DVIA (from Cadence design systems).

Looking up the j–$L_c$ curve in FIG. 7, the critical length (L) can be found, which is the maximum metal length allowed at the current density (js). Comparing 1 and Lc, if l>Lc, then a EM rule violation has been found. The metal line may then be marked for layout modification, such as either shortening or widening the line, thereby reducing current density as lower current density accommodates longer metal line lengths.

Figure 9:
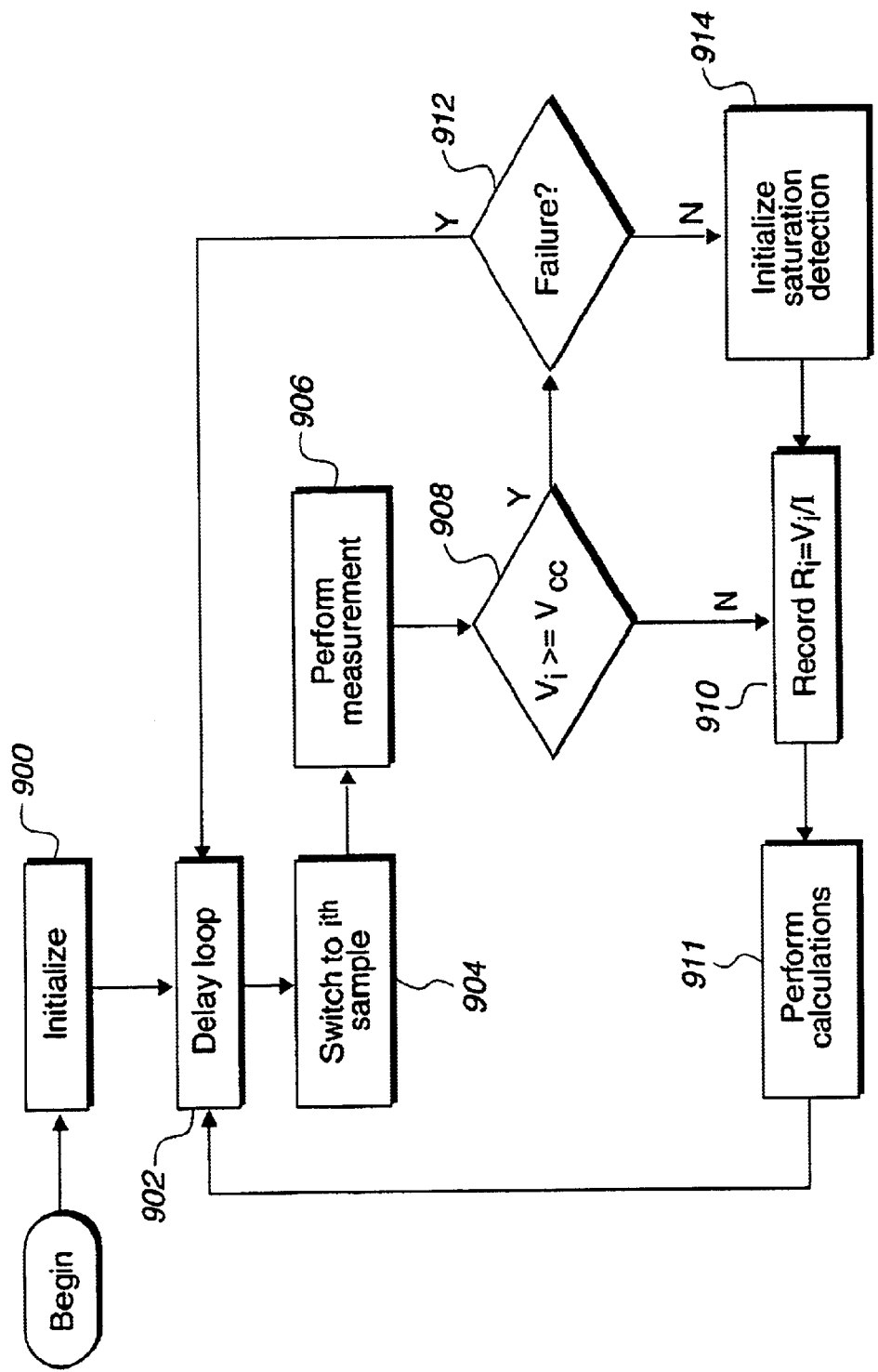
FIG. 9 is a flowchart of a method for electtomigration testing in accordance with this disclosure.

FIG. 9 is a flowchart of one aspect of a method in accordance with the teachings of this disclosure. The process of FIG. 9 may begin in act 900, where the system may initialize the various instruments used to perform the tests. Control data may also be obtained for parameters such as I and $V_c$.

The process of FIG. 9 may then proceed to a delay loop in act 902. The delay loop may be configured to provide a predetermined amount of delay to produce the signals disclosed above.

The process may then proceed to act 904, where the system may switch to an $i^{th}$ sample. As disclosed above, the disclosed test may be configured to sample a series a test strips in a particular order. It is contemplated that such an ordering may be accomplished in act 904.

In act 906, the system may perform a measurement as disclosed above. For example, the voltage for $i^{th}$ sample $V_i$ may be measured, and the appropriate time information recorded.

The process may then proceed to query 908, where it is determined whether $V_i >= V_{cc}$. If the condition of the query 908 is false, then the process may proceed to act 910, where $R_i == V_i/I$ may be selectively recorded for the current sample. The process may then proceed to act 911, where a variety of calculations may be performed. For example, the value of R may be calculated, the slope of R may be determined, or whether the slope of R is increasing or decreasing may be determined. Additionally, the value of the next time delay may be determined. The process may then return to act 902 with a time delay value as determined in act 911.

If the value of the query 908 is true, then the process may proceed to query. 912, where the system may determine whether a failure has occurred. If no failure has occurred, then the fact that $V_i >= V_{cc}$ may indicate that an EM condition has been detected. The process may then proceed to act 914, where saturation detection may be initiated. The process may then proceed to act 910 as described above.

In contrast to the old art, the EM screening methodology of the present disclosure concerns both current density and metal length. This way false EM rule violations may largely be reduced or eliminated, as prior art methodologies typically mark EM violations for all the metal line whenever the current density exceeds the design specific value, no matter how short the metal is. As shown herein, EM violations are false if the metal length is shorter then the critical length as discussed above. The methodology of this disclosure will not flag false EM violation if the critical length is satisfied as detailed above.

While embodiments and applications of this disclosure have been shown and described, it would be apparent to those skilled in the art that many more modifications and improvements than mentioned above are possible without departing from the inventive concepts herein. The disclosure, therefore, is not to be restricted except in the spirit of the appended claims.

What is claimed is:

1. An apparatus for determining the critical length of a conductor comprising:
   at least one device under test (DUT) including a decoder and selection circuitry for each said DUT;
   said at least one DUT including at least one test strip of a metal under test, said at least one test strip formed from a series of segments of the metal under test, wherein said metal under test of said series of segments are coupled together with segments of a connecting metal.

2. The apparatus of claim 1, wherein said apparatus includes a plurality of said DUTs, and wherein said segments of each of said plurality of DUTs has a unique length.

3. The apparatus of claim 2, wherein said DUT is embodied within a integrated circuit.

4. The apparatus of claim 3, wherein said integrated circuit containing said DUT is mounted on a hot chuck.

5. The apparatus of claim 1, wherein said apparatus is configured to detect electromigration in said DUT using Blech's law.

6. The apparatus of claim 5, wherein said plurality of DUT include metal strips under test ranging in length from approximately 10 µm to 320 µm.

7. The apparatus of claim 5, wherein said system is further configured to detect a rising voltage drop across said metal strips under test.

8. The apparatus of claim 1, wherein said connecting metal segments are approximately three times wider that the corresponding metal strip under test.

9. The apparatus of claim 8, wherein said metal strips under test and said connecting metal are coupled with vias.

10. The apparatus of claim 9, wherein said vias are formed from a electromigration-resistant metal.

11. The apparatus of claim 10, wherein said vias of formed from tungsten.

12. A method for determining the critical length of a conductor comprising:
    providing at least one DUT, said at least one DUT including at least one test strip of a metal under test and a decoder and selection circuitry, said at least one test strip formed from a series of segments of the metal under test;

providing a test signal to said at least one DUT;

sensing an output signal from said at least one DUT; and determining the critical length of a conductor from said output signal.

13. The method of claim 12, wherein said act of determining the critical length of a conductor is performed using Blech's law.

14. An apparatus for determining the critical length of a conductor comprising:

testing means for providing a test signal to at least one DUT, said at least one DUT including at least one test strip of a metal under test and a decoder and selection circuitry, said at least one test strip formed from a series of segments of the metal under test;

means for providing a test signal to said testing means;

means for sensing an output signal from said testing means; and means for determining the critical length of a conductor from said output signal.

15. The apparatus of claim 14, wherein said means for determining the critical length of a conductor is configured to use Blech's law.

16. The apparatus of claim 14, wherein said apparatus includes a plurality of said DUTs, and wherein said segments of each of said plurality of DUTs has a unique length.

17. The apparatus of claim 16, wherein said plurality of DUTs include metal strips under test ranging in length from approximately 10 $\mu$m to 320 $\mu$m.

18. The apparatus of claim 17, wherein said metal strips of said segments are coupled together with segments of a connecting metal.

19. The apparatus of claim 18, wherein said connecting metal segments are approximately three times wider that the corresponding metal strip under test.

20. The apparatus of claim 19, wherein said metal strips under test and said connecting metal are coupled with vias.

21. The apparatus of claim 20, wherein said vias are formed from a electromigration-resistant metal.

22. The apparatus of claim 21, wherein said vias of formed from tungsten.

23. The apparatus of claim 14, wherein said apparatus is configured to detect electromigration in said DUT using Blech's law.

24. The apparatus of claim 23, wherein said testing means is embodied within a integrated circuit.

25. The apparatus of claim 24, wherein said integrated circuit containing said DUT is mounted on a hot chuck.

26. The apparatus of claim 23, wherein said apparatus is further configured to detect a rising voltage drop across said metal strips under test.

* * * * *